United States Patent
Noto et al.

(10) Patent No.: US 9,557,853 B2
(45) Date of Patent: Jan. 31, 2017

(54) TOUCH DETECTING CIRCUIT AND SEMICONDUCTOR INTEGRATED CIRCUIT USING THE SAME

(71) Applicant: SYNAPTICS JAPAN GK, Tokyo (JP)

(72) Inventors: Takayuki Noto, Tokyo (JP); Akihito Akai, Tokyo (JP)

(73) Assignee: Synaptics Japan GK, Tokyo (JP)

( * ) Notice: Subject to any disclaimer, the term of this patent is extended or adjusted under 35 U.S.C. 154(b) by 95 days.

(21) Appl. No.: 14/607,913

(22) Filed: Jan. 28, 2015

(65) Prior Publication Data
US 2015/0212650 A1 Jul. 30, 2015

(30) Foreign Application Priority Data
Jan. 29, 2014 (JP) ................. 2014-013942

(51) Int. Cl.
*G06F 3/045* (2006.01)
*G06F 3/041* (2006.01)
*G01R 35/00* (2006.01)
*G01R 27/26* (2006.01)
*G06F 3/044* (2006.01)

(52) U.S. Cl.
CPC ......... *G06F 3/0418* (2013.01); *G01R 27/2605* (2013.01); *G01R 35/005* (2013.01); *G06F 3/044* (2013.01); *G06F 3/0412* (2013.01)

(58) Field of Classification Search
CPC .......... G06F 3/041; G06F 3/045; G06F 3/042; G06K 11/06; G08C 21/00
See application file for complete search history.

(56) References Cited

U.S. PATENT DOCUMENTS

| | | | | |
|---|---|---|---|---|
| 5,495,077 A | * | 2/1996 | Miller | G06F 1/1626 178/18.06 |
| 8,259,087 B2 | * | 9/2012 | Chen | G06F 3/044 178/18.06 |
| 8,717,325 B1 | * | 5/2014 | Hermes | G06F 3/044 345/173 |
| 2008/0088594 A1 | * | 4/2008 | Liu | G06F 3/044 345/173 |
| 2010/0302183 A1 | | 12/2010 | Kogo et al. | |
| 2011/0216031 A1 | * | 9/2011 | Chen | G06F 3/044 345/174 |
| 2013/0307821 A1 | | 11/2013 | Kogo | |

* cited by examiner

*Primary Examiner* — Pegeman Karimi
(74) *Attorney, Agent, or Firm* — Patterson + Sheridan, LLP

(57) ABSTRACT

A touch detecting circuit includes a discharging circuit, a detecting circuit, and a calibration circuit that is configured with a calibration capacitor connected to a terminal and a current source which is connected to the terminal and can be controlled so as to be on and off, that can be connected via the terminal to a sensing capacitor which is disposed on a touch panel, is provided. In the beginning, the sensing capacitor is charged to a predetermined voltage by the charging circuit, thereafter, in a process of discharging, a portion of charge amount that is discharged is used to charge the calibration capacitor, and another portion is discharged via the current source, and the rest is input to the detecting circuit. The detecting circuit measures the charge amount that is input.

20 Claims, 7 Drawing Sheets

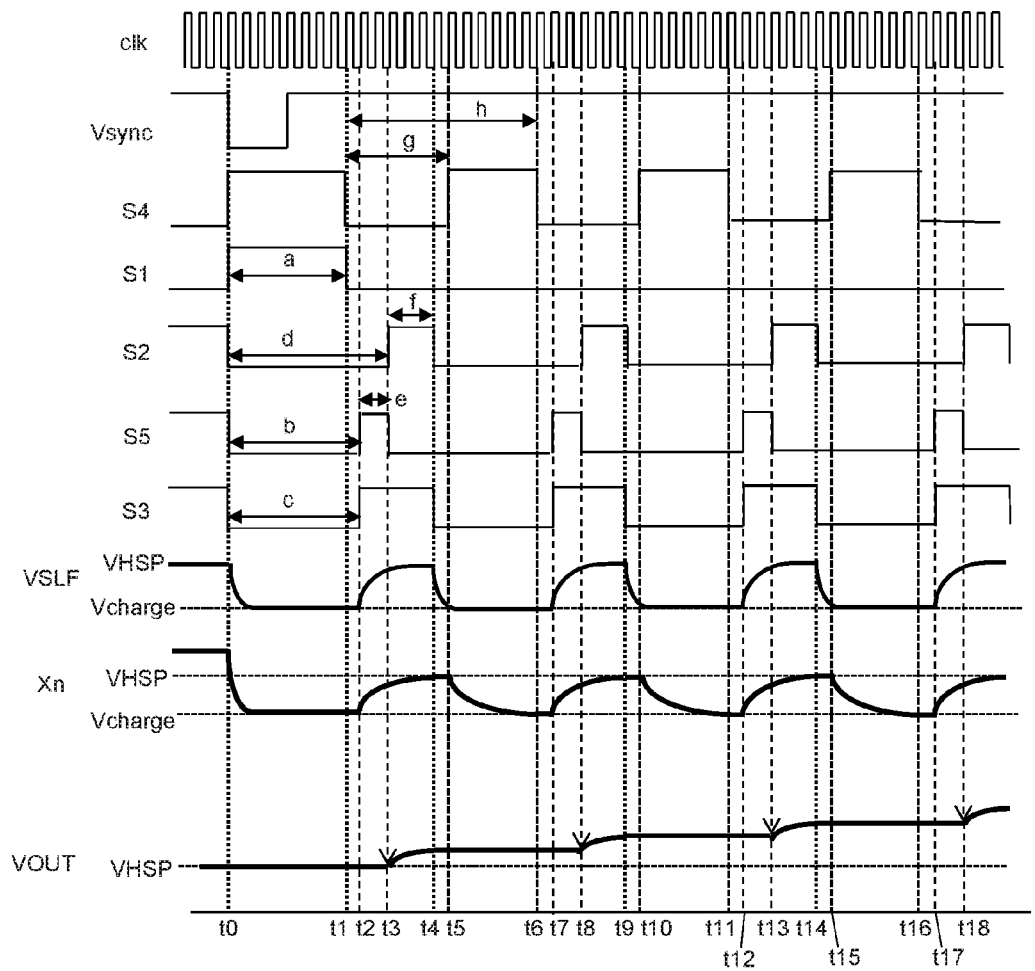

TOUCH DETECTING CIRCUIT AND SEMICONDUCTOR INTEGRATED CIRCUIT USING THE SAME

CROSS-REFERENCE TO RELATED APPLICATIONS

The Present application claims priority from Japanese application JP2014-013942 filed on Jan. 29, 2014, the content of which is hereby incorporated by reference into this application.

BACKGROUND

Field of the Disclosure

The present invention relates to a touch detecting circuit and a semiconductor integrated circuit using the touch detecting circuit, and particularly to a touch detecting circuit and a semiconductor integrated circuit using the touch detecting circuit that can be appropriately used for a touch panel control circuit which is connected to a touch panel that is overlapped with and mounted over a display panel.

Description of the Related Art

A touch panel is overlapped with and mounted over a display panel that is used for a smart phone or a tablet terminal, and a user can operate an apparatus by touching (contacting or tracing) a display screen using a finger or the like. In order to detect the touched position, various types have been proposed. For example, in a capacitance type, the touched coordinates are detected by detecting a change of a capacitance value caused by a finger or the like approaching a sensing capacitor that is disposed on a touch panel in a matrix. The capacitance type includes a mutual capacitance type and a self-capacitance type. In a state where one of electrodes that form a sensing capacitor is set as a transmission side and the other one of the electrodes is set as a reception side, the mutual capacitance type uses a phenomenon in which a coupling capacitance value that is generated between the transmission side and the reception side is decreased by an approach of a finger or the like. In a state where one electrode of a sensing capacitor is set as a ground potential, the self-capacitance type uses a phenomenon in which capacitance that is generated by approach of a human finger or the like which is grounded is added to the sensing capacitor, and thereby a capacitance value of the sensing capacitor is increased.

In JP-A-2011-14527, a touch detecting circuit of a self-capacitance type is disclosed. Electrodes in an X direction and electrodes in a Y direction are respectively arranged in a lattice pattern, and a sensing capacitor is formed at an intersection. A charging operation and a subsequent discharging operation are performed with respect to a capacitor that is selected by a combination of the electrodes in the X direction and the Y direction, and then a change of a capacitance value is detected.

In JP-A-2013-242699, a touch detecting circuit in which a self-capacitance type and a mutual capacitance type are combined is disclosed. When a multi-touch state is detected by the self-capacitance type, touched coordinates are detected by focusing only electrodes which are found to be in the multi-touch state using the mutual capacitance type detection.

SUMMARY

In one example, a touch detecting circuit is provided. The touch detecting circuit comprises a charging circuit, a detecting circuit, and a calibration circuit. The charging circuit and the detecting circuit are configured to be connected via a terminal to a sensing capacitor that is disposed on a touch panel. The calibration circuit includes a calibration capacitor that is coupled to the terminal. The charging circuit is configured to charge the sensing capacitor during a first period. The touch detecting circuit is configured to discharge the sensing capacitor during a second period after the first period. The calibration capacitor is configured to be charged by a first portion of electric charge that is discharged from the sensing capacitor, during a third period included in the second period. A second portion of the electric charge that are discharged from the sensing capacitor is discharged via the current source, during a fourth period included in the second period. A remaining portion of the electric charge of the electric charge discharged from the sensing capacitor is input to the detecting circuit, during the second period.

In another example, a touch detecting circuit is provided. The touch detecting circuit includes a discharging circuit, a detecting circuit, and a calibration circuit that includes a calibration capacitor that is connected to a terminal and that is configured to be coupled via the terminal to a sensing capacitor which is disposed on a touch panel. The discharging circuit is configured to discharge the sensing capacitor during a first period. The touch detecting circuit is configured to charge the sensing capacitor during a second period after the first period. The calibration capacitor is configured to be discharged by a first portion of electric charge that is charged to the sensing capacitor during a third period included in the second period. A second portion of the electric charge that is charged to the sensing capacitor is supplied from the current source during a fourth period included in the second period. A remainder of the electric charge of the electric charges charged to the sensing capacitor during the second period is input to the detecting circuit as negative charge amount.

In another example, a semiconductor integrated circuit is provided. The semiconductor integrated circuit includes a single semiconductor substrate on which a charging circuit, a detecting circuit, and a calibration circuit are disposed. The charging circuit and the detecting circuit are configured to be connected via a terminal to a sensing capacitor that is disposed on a touch panel. The calibration circuit includes a calibration capacitor that is coupled to the terminal. The charging circuit is configured to charge the sensing capacitor during a first period. The touch detecting circuit is configured to discharge the sensing capacitor during a second period after the first period. The calibration capacitor is configured to be charged by a first portion of electric charge that is discharged from the sensing capacitor, during a third period included in the second period. A second portion of the electric charge that are discharged from the sensing capacitor is discharged via the current source, during a fourth period included in the second period. A remaining portion of the electric charge of the electric charge discharged from the sensing capacitor is input to the detecting circuit, during the second period.

BRIEF DESCRIPTION OF THE DRAWINGS

FIG. 9 is a timing chart exemplifying an operation of the touch detecting circuit of FIG. 8.

DETAILED DESCRIPTION

Introduction

Figure 1:
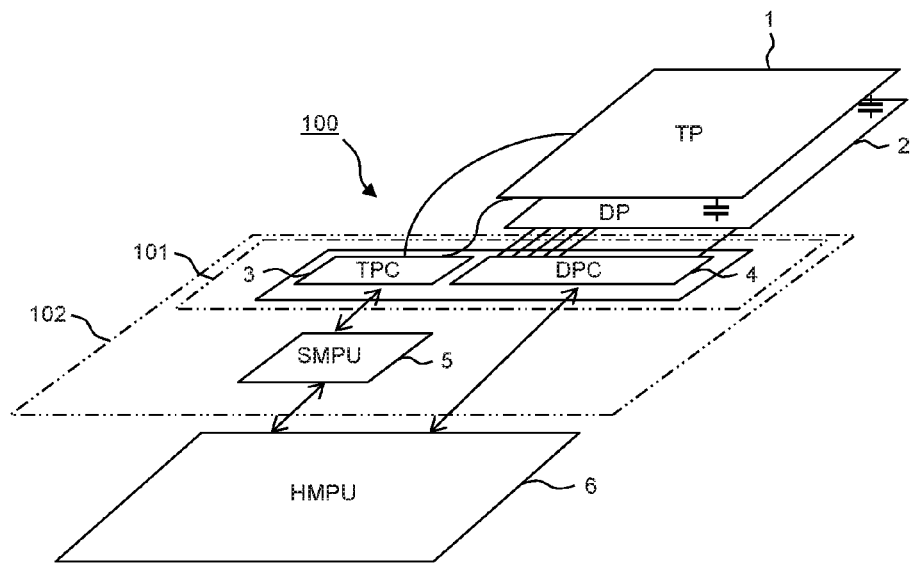
FIG. 1 is a block diagram illustrating a configuration of a display and input device that is an example of an electronic apparatus to which the invention is applied.

In a self-capacitance type of capacitive sensing, a touch detecting circuit that is connected to a sensing capacitor is configured to include a voltage applying circuit that charges the sensing capacitor, and a detecting circuit that receives an analog signal at the time of discharging. When electric charges that are accumulated in the sensing capacitor are discharged, the detecting circuit measures the charge amount, and thereby an actual magnitude (capacitance value) of the sensing capacitor is measured. In the self-capacitance type, a capacitance value of the sensing capacitor is effectively increased by touch, and thus, in touch detection and non-touch detection, an increased amount is a detection target. In order to efficiently detect an increased amount of the capacitance value caused by touch, a capacitance value of the sensing capacitor at the time of non-touch may be subtracted from a measured capacitance value of the sensing capacitor. For this reason, a technology has been known, in which a capacitor with a magnitude (capacitance value) that is approximately equal to that of the sensing capacitor at the time of non-touch is connected as a calibration capacitor. Particularly, a capacitor 8 in JP-A-2011-14527 corresponds to this.

Such a calibration capacitor is required to have a magnitude (capacitance value) that is approximately equal to that of the sensing capacitor at the time of non-touch, and thus, it is difficult to integrate the calibration capacitor into a semiconductor integrated circuit (IC). For example, in JP-A-2011-14527, a capacitance value of a touch electrode is 10 pF, a capacitance value of the capacitor 8 is 1 pF to 50 pF, and the touch electrode and the capacitor 8 are connected (externally attached) to an external portion of an IC for touch sensor (refer to paragraphs 0019 and 0020 of JP-A-2011-14527). When the touch detecting circuit includes a plurality of detecting circuits in order to sense a plurality of sensing capacitors simultaneously, it is necessary to include the same number of calibration capacitors, and thus, it is difficult to integrate the calibration capacitor. In order to externally attach the calibration capacitor, a plurality of terminals would be used, and a mounting area on a substrate for mounting the calibration capacitor would be used.

The invention provides a detecting circuit that can be operated at high detection sensitivity, by using a calibration capacitor with a small capacitance value, in the same manner as that obtained by subtracting a capacitance value of a sensing capacitor at the time of non-touch from a capacitance value of the sensing capacitor that is measured.

According to an embodiment, the following description is provided.

That is, a touch detecting circuit that includes a charging circuit that can be connected via a terminal to a sensing capacitor which is disposed on a touch panel, a detecting circuit, and a calibration circuit that is configured with a calibration capacitor connected to the terminal and a current source which is connected to the terminal and can be controlled so as to be on and off, operates as follows.

In the beginning, the sensing capacitor is charged to a predetermined voltage by the charging circuit, thereafter charge amount that is discharged is detected in a process of discharging, and thereby a capacitance value of the sensing capacitor is measured. Based on the increased amount corresponding to the capacitance value at the time of non-touch, touch and non-touch is determined. At this time, a portion of the charge amount that is discharged is used for charging the calibration capacitor, another portion of the charge amount is discharged via the current source, and the rest of the charge amount is input to the detecting circuit. The detecting circuit measures charge amount that is input.

In the beginning, the sensing capacitor is pre-charged to a predetermined voltage by the charging circuit or discharged, thereafter charge amount that is supplied so as to charge is detected in a process of discharging, and thereby a capacitance value of the sensing capacitor may be measured. At this time, the charge amount that is input to the detecting circuit has a negative value, and the invention may be configured in such a manner that in order to reduce an absolute value of the charge amount, the charge amount which is charged in the calibration capacitor in advance and the charge amount that is supplied from the current source are added so as to charge the sensing capacitor.

Advantages that are obtained by the embodiments are briefly described as follows.

That is, in the same manner as that obtained by subtracting a capacitance value of a sensing capacitor at the time of non-touch from a capacitance value of the sensing capacitor to be measured, it is possible to operate a detecting circuit at high detecting sensitivity by using a calibration capacitor with a small capacitance value.

1. Summary of the Embodiments

First, summary of representative embodiments of the invention disclosed in the application will be described. Reference numerals in drawings in parentheses referred to in description of the summary of the representative embodiments just denote components included in the concept of the components to which the reference numerals are designated.

[1] Calibration Capacitance reduction due to Withdrawal of Discharging Electric Charges A touch detecting circuit 301 according to a representative embodiment described in the present application includes a charging circuit 11 that can be connected via a terminal Xn to a sensing capacitor Cxy which is disposed on a touch panel 1, a detecting circuit 10, and a calibration circuit 12 that is configured with a calibration capacitor Cc connected to the terminal and a current source 13 which is connected to the terminal and can be on and off. The touch detecting circuit 301 is configured as follows (refer to FIGS. 6 and 7).

The charging circuit can charge the sensing capacitor during a first period (a; t0 to t1). The touch detecting circuit can discharge the sensing capacitor during a second period (g; t1 to t5) after the first period. During a third period (t2 to t4) that is included in the second period, the calibration capacitor is charged with a portion of the electric charge that is discharged from the sensing capacitor. During a fourth period (e; t2 to t3) that is included in the second period, another portion of the electric charge that is discharged from the sensing capacitor is discharged via the current source.

The rest of the electric charge of the electric charge that are discharged from the sensing capacitor during the second period is input to the detecting circuit, and the detecting circuit is configured so as to be able to measure the charge amount that is input.

As a result, by using the calibration capacitor with a small capacitance value, the detecting circuit can be operated at a high detection sensitivity, in the same manner as that obtained by subtracting a capacitance value of a sensing capacitor at the time of non-touch from a capacitance value of the sensing capacitor that is measured. During the second period, a portion of the electric charge that is discharged from the sensing capacitor is discharged via the current source, another portion of the electric charges is used to charge the calibration capacitor, and the rest of the electric charge is input to the detecting circuit. The sum of the charge amount that is discharged via the current source and the charge amount that is charged to the calibration capacitor is set to be approximately the same value as that of the charge amount that is discharged from the capacitance value of the sensing capacitor at the time of non-touch, and thereby only the charge amount corresponding to the capacitance value of the sensing capacitor that is increased by the touch are input to the detecting circuit. At this time, the charge amount that is discharged via the current source are specified by the product of a current value of the current source and the fourth period, and thus this value is set to be a value close to the charge amount that is discharged from the capacitance value of the sensing capacitor at the time of non-touch as far as possible, and thereby the capacitance value of the calibration capacitor can be with a small value. The current source or a control circuit during the operation period (fourth period) can be mounted in a much smaller area than a capacitor on an IC chip, and is appropriate for integration.

[2] Detecting Circuit=Integration Circuit

In item 1, the charging circuit includes a voltage source (for example, VSLF that is generated and output by a voltage follower AMP2) that outputs a first voltage Vcharge during the first period and outputs a second voltage VHSP lower than the first voltage during the second period, and a first switch S4 that is connected between an output of the voltage source and the terminal. The detecting circuit is configured to include an operational amplifier AMP1 having a positive side input to which the second voltage is applied, an integral capacitor Cs1 that is connected between a negative side input of the operational amplifier and an output thereof, and a second switch S2 that is connected between the terminal and the negative side input of the operational amplifier. The calibration capacitor is connected between the terminal and the voltage source.

As a result, the detecting circuit is configured as the integration circuit, and it is possible to mount the entire touch detecting circuit including the calibration capacitor as an integrated circuit (IC).

[3] Touch Panel Controller

In item 1 or 2, the touch panel includes a plurality of sensing capacitors, and a touch panel controller (TPC;3) includes plural sets of charging circuits 11_1 to 11_n, detecting circuits 10_1 to 10_n and calibration circuits 12_1 to 12_n which correspond to the plurality of sensing capacitors, a plurality of sample and hold circuits (SH; 302) that can respectively retain the outputs of the plurality of detecting circuits, a selector (SLCT; 303) that selects one output among the outputs of the plurality of sample and hold circuits and outputs the selected output, and an analog/digital conversion circuit (ADC; 304) that converts the output of the selector into a digital value Dout and outputs the converted output.

As a result, it is possible to provide the touch detecting circuit 301 and the touch panel controller (TPC;3) including the touch detecting circuit 301 that can be operated by being connected to the touch panel including the plurality of sensing capacitors.

[4] Calibration Capacitance Reduction due to Addition of Charging Electric Charges The touch detecting circuit 301 according to a representative embodiment described in the present application includes the discharging circuit 11, the detecting circuit 10, and the calibration circuit 12 that is configured with the calibration capacitor Cc connected to the terminal and the current source 13 which is connected to the terminal and can be on and off that can be connected via the terminal Xn to the sensing capacitor Cxy disposed on the touch panel 1. The touch detecting circuit 301 is configured as follows (refer to FIGS. 8 and 9).

The discharging circuit can discharge the sensing capacitor during the first period (a;t0 to t1). The touch detecting circuit can charge the sensing capacitor during the second period (g;t1 to t5) after the first period. The calibration capacitor is discharged by a portion of the electric charge which is charged in the sensing capacitor during the third period (t2 to t4) that is included in the second period. Another portion of the electric charge that is charged in the sensing capacitor is supplied from the current source during the fourth period (e;t2 to t3) that is included in the second period. The rest of the electric charge among the charge that are charged in the sensing capacitor during the second period is input to the detecting circuit as negative charge amount, and the detecting circuit is configured to be able to measure the charge amount that is input.

As a result, by using the calibration capacitor with a small capacitance value, the detecting circuit can be operated at high detection sensitivity, in the same manner as that obtained by subtracting a capacitance value of the sensing capacitor at the time of non-touch from the capacitance value of the sensing capacitor to be measured. During the second period, a portion of the electric charge that is charged in the sensing capacitor is supplied from the current source, another portion of the electric charge is supplied by being discharged from the calibration capacitor, and the rest of the charge amount is input to the detecting circuit as negative charge amount. The sum of the charge amount that is supplied from the current source and the charge amount that is supplied from the calibration capacitor is set so as to be approximately the same value as the charge amount for charging the capacitance value of the sensing capacitor at the time of non-touch, and thereby only the charge amount corresponding to the capacitance value of the sensing capacitor that is increased by touching are input to the detecting circuit as negative charge amount. At this time, since the charge amount that is supplied from the current source are specified by the product of the current value of the current source and the fourth period, this value is set to a value close to the charge amount for charging the capacitance value of the sensing capacitor at the time of non-touch as far as possible, and thereby the capacitance value of the calibration capacitor can be with a small value. The current source or the control circuit during the operation period (fourth period) can be mounted in a much smaller area than a capacitor on an IC chip, and is appropriate for integration.

[5] Detecting Circuit=Integration Circuit

In item 4, the charging circuit includes a voltage source (for example, VSLF that is generated and output by a voltage follower AMP2) that outputs a first voltage Vcharge during the first period and outputs a second voltage VHSP higher than the first voltage during the second period, and a first switch S4 that is connected between an output of the voltage source and the terminal. The detecting circuit is configured to include an operational amplifier AMP1 having a positive side input to which the second voltage is applied, an integral capacitor Cs1 that is connected between a negative side input of the operational amplifier and an output, and a second switch S2 that is connected between the terminal and the negative side input of the operational amplifier. The calibration capacitor is connected between the terminal and the voltage source.

As a result, the detecting circuit is configured as the integration circuit, and it is possible to mount the entire touch detecting circuit including the calibration capacitor as an integrated circuit (IC).

[6] +SH+Selector+ADC

In item 4 or 5, the touch panel includes a plurality of sensing capacitors, and the touch panel controller (TPC;3) includes plural sets of charging circuits $11\_1$ to $11\_n$, detecting circuits $10\_1$ to $10\_n$ and calibration circuits $12\_1$ to $12\_n$ which are corresponding to the plurality of sensing capacitors, a plurality of sample and hold circuits (SH;302) that can respectively retain the outputs of the plurality of detecting circuits, a selector (SLCT;303) that selects one output among the outputs of the plurality of sample and hold circuits and outputs the selected output and an analog/digital conversion circuit (ADC; 304) that converts the output of the selector into a digital value and outputs the converted output.

As a result, it is possible to provide the touch detecting circuit 301 and the touch panel controller (TPC;3) including the touch detecting circuit 301 that can be operated by being connected to the touch panel including plurality of sensing capacitors.

[7] Touch Panel Controller IC

The semiconductor integrated circuit according to a representative embodiment described in the present application is semiconductor integrated circuits 3, 101 and 102 that includes the touch detecting circuit which is described in item 3 or 6 on a single semiconductor substrate.

As a result, the touch panel controller IC including the touch detecting circuit with high detection sensitivity is provided.

[8] Display Driver+Touch Panel Controller IC

In item 7, semiconductor integrated circuits 101 and 102 that further includes a display drive circuit (DPC; 4) that is connected to the display panel 2 which is configured to overlap the touch panel and can drive and control the display panel, on the semiconductor substrate is provided.

As a result, there is provided an IC that is connected to a display and touch panel in which the touch panel is stacked on the display panel and the two are configured to be one piece, that is, integrated. Thus, it is easy to link the display drive and touch sense control with each other.

[9] Display Drive+Touch Panel Controller+Microcontroller IC

In item 8, a semiconductor integrated circuit 102 that further includes a microcontroller (SMPU, 5) which can control the touch detecting circuit and can read data based on the output of the detecting circuit, on the semiconductor substrate is provided.

As a result, an IC that is obtained by further integrating the microcontroller on the same chip is provided, and thus, it is easy to link the display drive and the touch sense control with each other, and it is possible to reduce a burden of an application processor that is externally attached.

2. Further Detailed Description of the Embodiments

The embodiments will be described in further detail.

[First Embodiment]

FIG. 1 exemplifies an entire configuration of a display and input device 100 to which the invention is applied. The display and input device 100 illustrated in FIG. 1 is an example of an electronic apparatus according to the invention, configures a portion of a mobile terminal such as a personal digital assistant (PDA) or a cellular phone, and includes a touch panel (TP) 1, a display panel (DP) 2, a touch panel controller (TPC) 3, a display panel controller (DPC) 4, a sub-processor (SMPU) 5, and a host processor (HMPU) 6. It is possible to realize a single semiconductor device (IC) 101 or 102 by forming the touch panel controller 3 and the display panel controller 4, which further including the sub-processor 5 as occasion demands, on one semiconductor chip, or for example, by mounting a multi-chip module in one package. While not being particularly limited, the semiconductor device (IC) 101 or 102 is formed on a single semiconductor substrate such as silicon, using a technology of manufacturing, for example, a known complementary metal oxide semiconductor field effect transistor (CMOS-FET) large scale integrated circuit (LSI). By mounting the touch panel controller 3 and the display panel controller 4 as the IC 101 of one chip, when being connected to a display and touch panel of, for example, in-cell type that is obtained by stacking the touch panel 1 over the display panel 2, thereby configuring one-piece, it is easy to link the display drive and the touch sense control with each other. In addition by further integrating the sub-processor (SMPU) 5 on the same chip 102, it is easy to mutually link display drive and touch sense control, and it is possible to reduce a burden of a host processor (HMPU) 6 that is externally attached.

A plurality of sensing capacitors is formed in the touch panel 1. The touch panel controller 3 obtains detection data depending on variation of capacitance components of each sensing capacitor. The sub-processor (SMPU) 5 that is a microprocessor for a sub-system controls drive of the touch panel 1, and performs processing of detecting a touch state or coordinates from the detection data that is obtained by the touch panel controller 3. For example, the sub-processor 5 performs a digital filter calculation with respect to the detection data, performs computation of calculating a center of two-dimensional distribution of a capacitance value from the data in which noise is removed by the digital filter calculation, and calculates touched position coordinates. In short, in order to indicate where a position of the sensing capacitor in which a stray capacitance varies is, that is, where a position of the touch panel 1 in which a finger approaches (touches or contact event occurs) is, the position coordinates in which the contact event occurs is computed.

The touch panel 1 is configured with a transparent (translucent) electrode or a dielectric film, and is disposed so as to be overlapped with a display surface of the display panel 2, for example. The touch panel 1 and the display panel 2 may be an in-cell configuration in which the touch panel 1 and the display panel 2 are mounted in one piece, may be an on-cell configuration in which the touch panel 1 and the display panel 2 are separately manufactured, overlapped with each other, and mounted in one piece, and may be a cover glass one-piece configuration which is configured by making the touch panel 1 and the cover glass installed on an upper surface as one piece.

The host processor (HMPU) 6 generates display data, and the display panel controller 4 performs display control of the display data received from the host processor 6 so as to display on the display panel 2. The host processor 6 acquires data of position coordinates when the contact event occurs from the sub-processor 5, and analyzes an input performed by the operation of the touch panel 1, from a relationship between the data of position coordinates of the display panel 2 and a display screen in which the data of the position coordinates are given to the display panel controller 4 to be displayed.

While not being particularly limited, illustration in the host processor 6 is respectively omitted, and by embedding or connecting a communication control unit, an image processing unit, a sound processing unit, accelerator, and the like, for example, a mobile terminal is configured.

Figure 2:
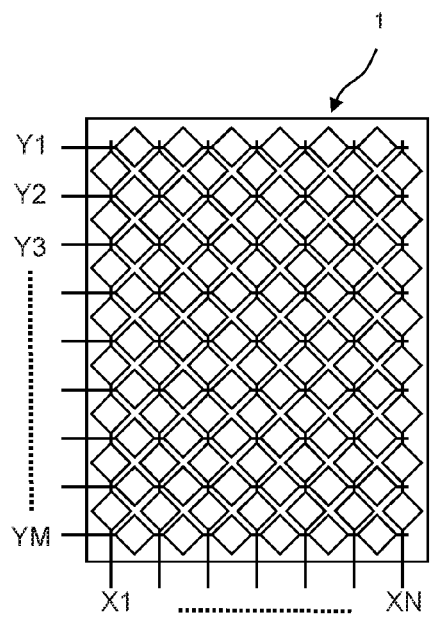
FIG. 2 is a plan view exemplifying an electrode configuration of a touch panel.

FIG. 2 exemplifies an electrode configuration of the touch panel 1. A plurality of sensing electrodes is formed on the touch panel 1. For example, a plurality of drive electrodes (Y electrodes) Y1 to YM (may be referred to as Y electrodes Ym) that is formed in a horizontal direction of the touch panel 1, and a plurality of detecting electrode (X electrode) X1 to XN (may be referred to as X electrodes Xn) that is formed in a vertical direction are configured to be electrically insulated with respect to each other, and a sensing capacitor is formed at an intersection of the X electrode and the Y electrode. In a self-capacitance type of capacitive sensing, by fixing a potential of an electrode in one direction to a predetermined potential and measuring a capacitance value of a sensing capacitor viewed from an electrode in another direction, determination of touch and non-touch to the sensing capacitor is performed, or calculation of the touched coordinates is performed from a two-dimensional distribution of the capacitance value. While not being particularly limited, furthermore, a potential of the Y electrode is fixed, and detection of touch and non-touch to the sensing capacitor viewed from the X electrode is performed. In contrast to this, a potential of the X electrode is fixed, and detection of touch and non-touch to the sensing capacitor viewed from the Y electrode is performed. According to this, determination of touch and non-touch to the two-dimensional sensing capacitor can be performed. In addition, if the touch panel 1 is configured as described above, it is possible to combine and perform the detection of touch and non-touch in the mutual capacitance type. FIG. 2 illustrates the touch panel 1 having electrodes of a diamond shape, but the electrodes may have another shape such as a lattice shape.

Figure 3:
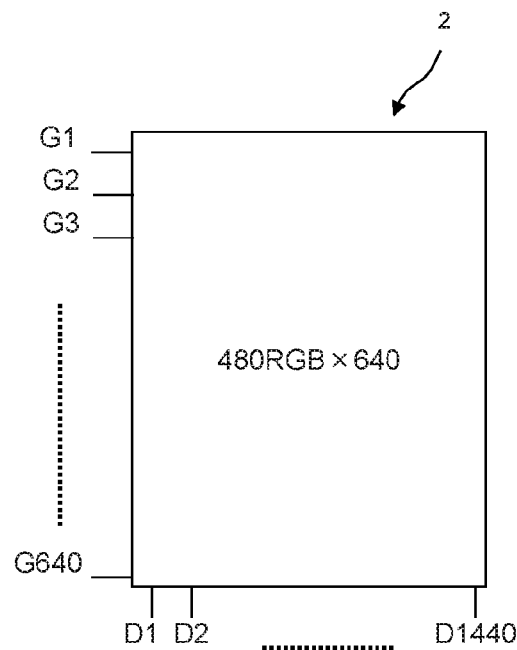
FIG. 3 is a plan view exemplifying an electrode configuration of a display panel.

FIG. 3 illustrates an electrode configuration of the display panel 2. A display size of the display panel 2 illustrated in FIG. 3 is, for example, 480 RGB×640 that is VGA. In the display panel 2, gate electrodes G1 to G640 that are scan electrodes formed in a horizontal direction, and drain electrodes D1 to D1440 that are signal electrodes formed in a vertical direction are disposed, and a plurality of display cells are disposed in which selection terminals are connected to corresponding scan electrodes at the intersections and input terminals are connected to corresponding signal electrodes. For example, the gate electrodes G1 to G640 are sequentially driven (scan-driven) by scan pulses that are applied from the display panel controller 4. Gradation data of scan drive lines are supplied to the drain electrodes D1 to D1440 in synchronization with the scan drive of the gate electrode. A display size of the display panel 2 is not limited to the illustrated display size, and can be formed arbitrarily.

Figure 4:
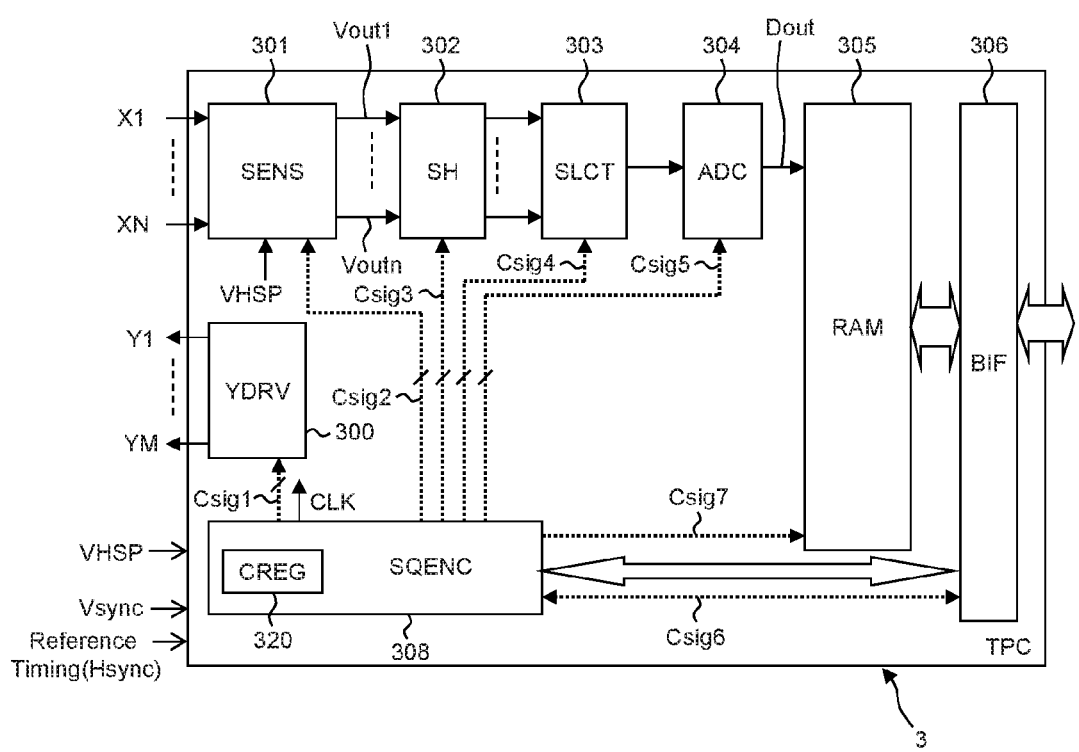
FIG. 4 is a block diagram exemplifying a configuration of a touch panel controller.

FIG. 4 exemplifies a configuration of the touch panel controller 3. The touch panel controller 3 includes a drive circuit (YDRV) 300, a touch detecting circuit (SENS) 301, a sample and hold circuit (SH) 302, a selector (SLCT) 303, an analog-digital conversion circuit (ADC, referred to as AD conversion circuit hereinafter) 304, a random access memory (RAM) 305, a bus interface circuit (BIF) 306, and a sequence control circuit (SQENC) 308 as a control circuit. The sequence control circuit (SQENC) 308 can set a control sequence in a programmable manner, and it is appropriate for the sequence control circuit to be configured with a control register (CREG) 320. The control register (CREG) 320 may be configured by a non-volatile memory element, may be configured by a volatile memory element, and may be configured so as to be able to be initialized or appropriately modified (rewritten) by the sub-processor (SMPU) 5 or the like.

The drive circuit 300 is provided to drive Y electrodes Y1 to YM, when touch detection of the mutual capacitance type is performed. In a case of only touch detection of the self-capacitance type, the drive circuit 300 may be omitted.

The touch detecting circuit 301 measures the sensing capacitor that is connected to the X electrodes X1 to XN, and outputs voltages Vout1 to Voutn corresponding to capacitance values thereof. The output voltages Vout1 to Voutn are retained in the sample and hold circuit 302, the retained output voltages are selected by the selector 303, and the selected output voltage is converted into digital detection data Dout by the AD conversion circuit 304. The converted detection data is stored in the RAM 305. The detection data that is stored in the RAM 305 is supplied to the sub-processor 5 via the bus interface circuit 306, and is used for computation of the touch coordinates.

The sequence control circuit 308 controls operations of the drive circuit 300, the touch detecting circuit 301, the sample and hold circuit 302, the selector 303, the AD conversion circuit 304, and the bus interface circuit 306, using control signals Csig1 to Csig6, and in addition, performs access control of the RAM 305 using a control signal Csig7. The sequence control circuit 308 receives, for example, a vertical synchronization signal Vsync or a horizontal synchronization signal Hsync, as a reference signal for timing, from an external portion, and performs sequence control, in synchronization with a clock CLK that is separately input or is internally generated.

Figure 5:
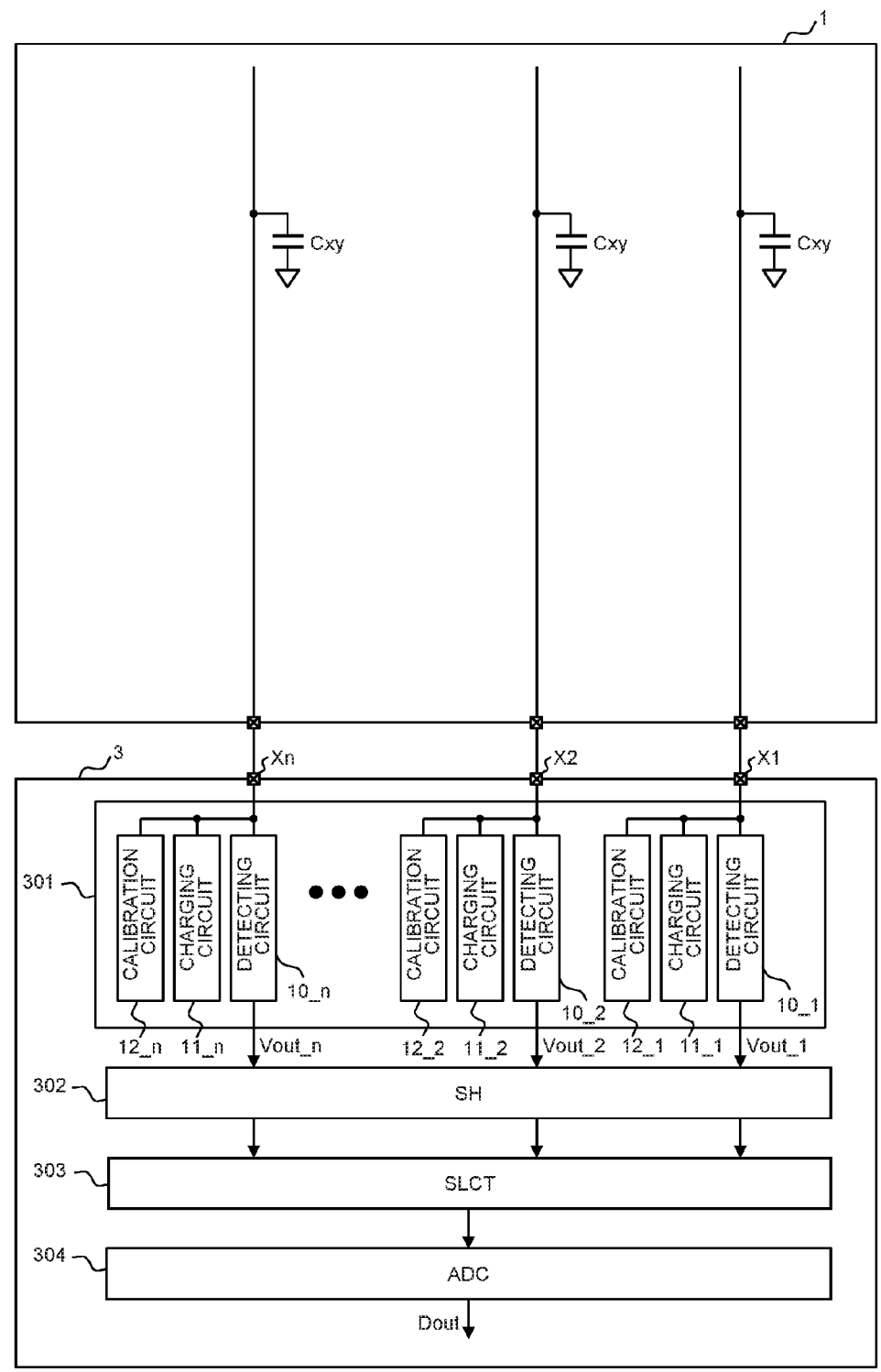
FIG. 5 is a block diagram exemplifying an example of an equivalent circuit of a touch panel, and a touch detecting circuit.

FIG. 5 illustrates an example of an equivalent circuit of the touch panel 1 and the touch detecting circuit 301. The touch detecting circuit 301 includes the detecting circuits 10_1 to 10_n, the charging circuits 11_1 to 11_n, and the calibration circuits 12_1 to 12_n that are connected to terminals X1 to Xn corresponding to each of the X electrodes X1 to XN. There are various modification examples for a configuration of the electrode of the touch panel 1 and the sensing capacitor, FIG. 5 illustrates that one sensing capacitor Cxy is connected to one set of the detecting circuit 10, the charging circuit 11 and the calibration circuit 12 via one terminal (one of X1 to Xn). FIG. 5 schematically illustrates that an operation of one detecting circuit is an operation of electrically measuring one sensing capacitor which is a measurement target, but actually, the sensing capacitor may be a synthesized capacitor of a plurality of electrodes, or a configuration in which a plurality of sensing capacitors are sequentially selected one by one by a selection circuit or the like, which may be added and the selected sensing capacitor becomes a measurement target. The outputs Vout1 to Voutn of the detecting circuits 10_1 to 10_n are transferred to the sample and hold circuit (SH) 302 and retained as voltage values. The selector (SLCT) 303 sequentially selects the voltage values that are retained in the sample and hold circuit (SH) 302, based on the control signal Csig4, and inputs the selected voltage to the AD conversion circuit 304.

A configuration and an operation of the touch detecting circuit 301 will be described in further detail.

Figure 6:
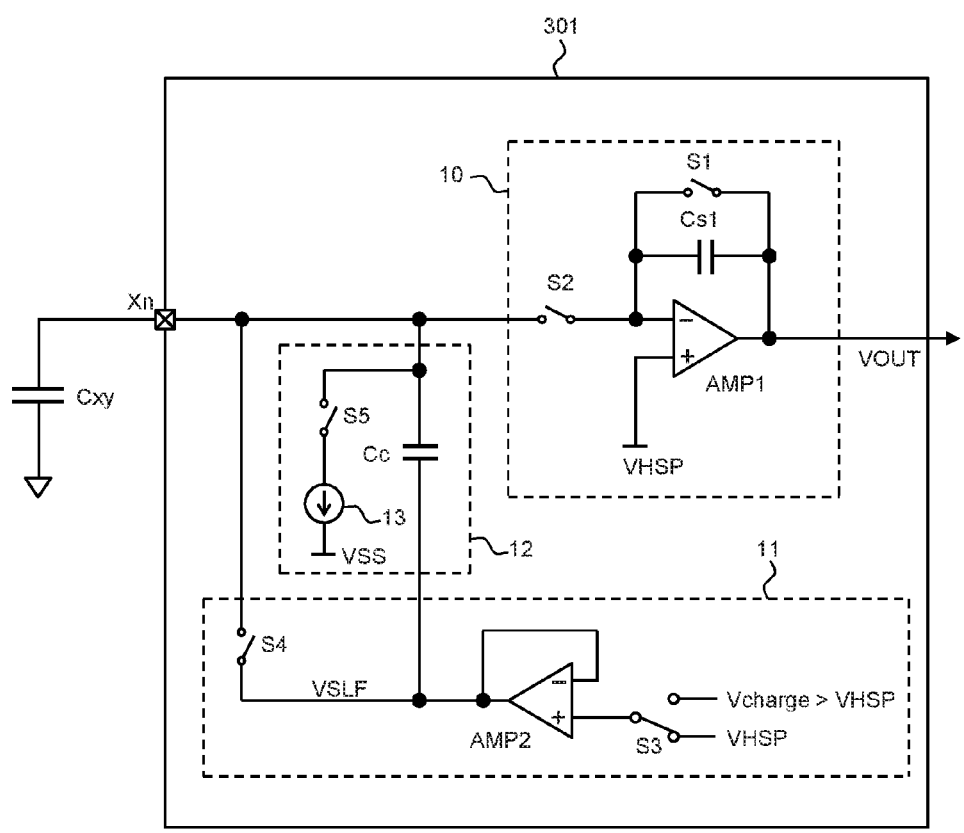
FIG. 6 is a circuit diagram partially exemplifying a configuration of a touch detecting circuit according to an embodiment of the invention.

FIG. 6 is a circuit diagram partially exemplifying a configuration of the touch detection circuit according to an embodiment of the invention. Only a circuit that uses one sensing capacitor Cxy as a detection target is illustrated. The touch detecting circuit 301 is configured by the detecting circuit 10, the charging circuit 11, and the calibration circuit 12 that are connected to one sensing capacitor Cxy which is a detection target via the terminals Xn (any one of X1 to Xn).

The detecting circuit 10 is, for example, an integration circuit as illustrated in FIG. 6, adds the charge that is input and accumulated, and outputs the charge. That is, the detecting circuit 10 that is an integration circuit is configured to include an operational amplifier AMP1 in which a positive side input is fixed to an initial voltage VHSP, an integration capacitor Cs1 that is connected between a negative side input of the operational amplifier AMP1 and the output, a switch S1 that can disconnect the integration capacitor Cs1, discharge, and initialize, and a switch S2 that can control connection and disconnection of the negative side input of the operational amplifier AMP1 which is an input of the integration circuit, and the terminal Xn.

The charging circuit 11 is configured to include VSLF that is a voltage source and a switch S4 that can control connection and disconnection of the voltage source VSLF and the terminal Xn. The voltage source VSLF is configured by a voltage follower amplifier that is formed by the switch S3 and the operational amplifier AMP2. By switching the switch S3, the voltage source VSLF is controlled to be the initial voltage VHSP or a charging voltage Vcharge with a higher potential than the initial voltage.

The calibration circuit 12 is configured to include a calibration capacitor Cc, a switch S5, and a current source 13. The calibration capacitor Cc is connected between the terminal Xn and the voltage source VSLF, and the current source 13 is connected to the terminal Xn via the switch S5. The other terminal of the current source 13 is fixed to an arbitral potential, which is lower than Vcharge or VHSP, for example, a ground potential VSS or the like.

Figure 7:
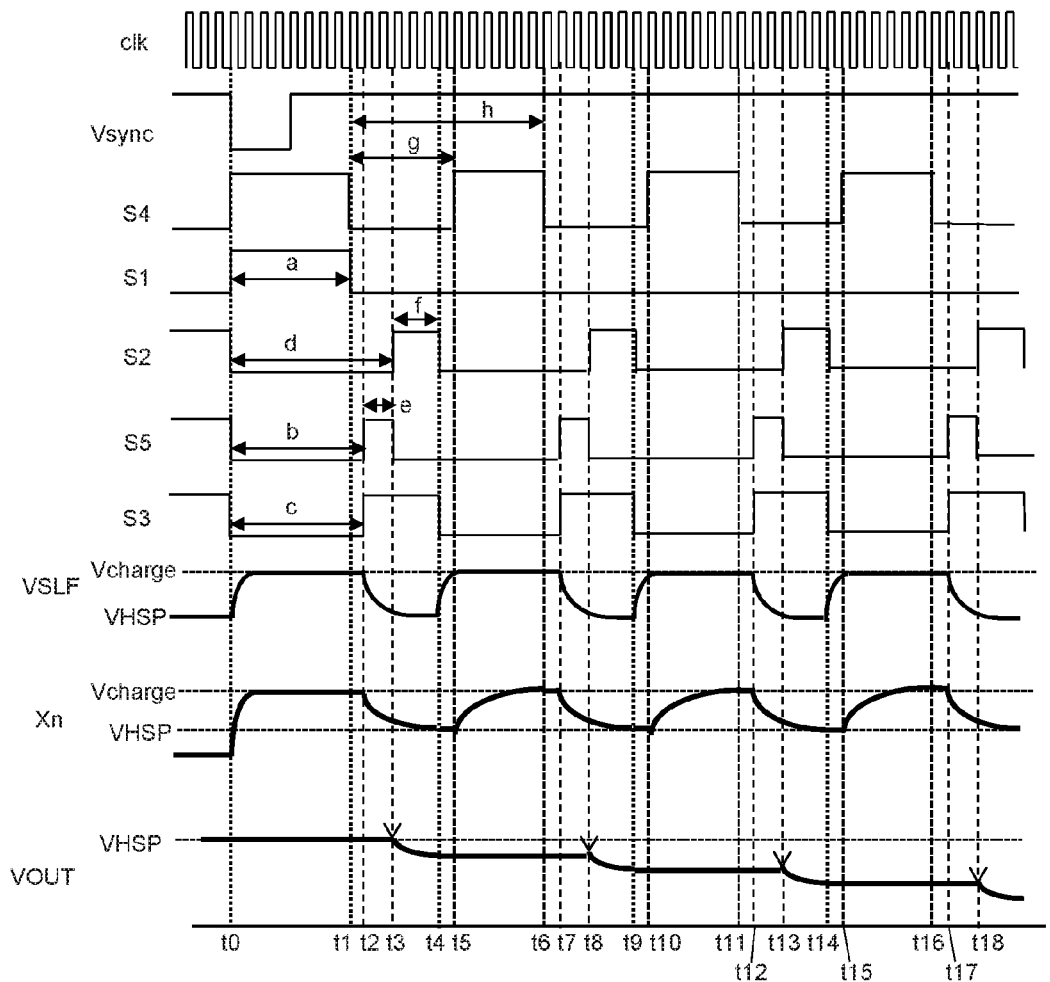
FIG. 7 is a timing chart exemplifying an operation of the touch detecting circuit of FIG. 6.

FIG. 7 is a timing chart exemplifying an operation of the touch detecting circuit of FIG. 6. A horizontal axis denotes time, and on a vertical axis, a clock clk, a vertical synchronization signal Vsync, and signals that control the switches S4, S1, S2, S5, and S3, are illustrated from the top as digital waveforms, and furthermore, the power supply VSLF, a potential of the terminal Xn, and a voltage of the output Vout are illustrated as analog waveforms. As illustrated in FIG. 7, the signals that control the switches S1, S2, S4, and S5 are positive logic, and when the signal is a high level, each switch is closed (on), and when the signal is a low level, each switch is opened (off). Although positive logic is described, the positive logic can be easily modified to a negative logic.

The period a of times t0 to t1 is a charging period in which the sensing capacitor Cxy is charged by the charging circuit 11, and at the same time, initialization of the integration circuit is performed. At the time t0 when the vertical synchronization signal Vsync changes, the power supply VSLF is set to a potential Vcharge higher than the voltage VHSP by the switch S3, and by closing the switch S4, the sensing capacitor Cxy is charged to the potential Vcharge via the terminal Xn. In the same time t0, the switch S2 that is an input of the integration circuit is opened and thereby the input is blocked. As the switch S1 is closed, the integration capacitor Cs1 is short circuited, discharged, and initialized, and the output VOUT is initialized to an initial voltage VHSP. At this time, the switch S5 is in an opened state and the current source 13 is blocked from the terminal Xn. In addition, the calibration capacitor Cc is short circuited by the switch S4, and the electric charge is not accumulated. In time t1, the switch S4 is opened, and thereby charging of the sensing capacitor is stopped, and in addition, the switch S1 is opened, and thereby the initialization of the integration is completed.

Thereafter, during a period of times t2 to t4, the power supply VSLF is set to the voltage VHSP by the switch S3, and the electric charges from the sensing capacitor Cxy flow into the calibration capacitor Cc. During the period, in a period e of first half of the times t2 to t3, the switch S5 is closed, the current source 13 is connected to the terminal Xn, and the electric charge with a constant charge amount is withdrawn from the sensing capacitor Cxy. At this time, the withdrawn charge amount is specified by the product of the current value of the current source 13 and the period e. In a period f of second half of the times t3 to t4, the switch S2 is closed, and the electric charge from the sensing capacitor Cxy is also input to the integration circuit. As illustrated in FIG. 6, the integration circuit is configured with the operational amplifier AMP1 that is virtually grounded to the initial voltage VHSP, and thus, a potential of the terminal Xn to which the sensing capacitor Cxy is connected is gradually close to the voltage VHSP. The electric charge that is input to the integration circuit is accumulatively added (integrated) to the integration capacitor Cs1, and thereby the output VOUT is changed (decreased).

Thereafter, a period of times t5 to t6 is a second charging period. The switch S1 for the initialization of the integration circuit is not closed (integration circuit is not initialized), but the other operations are the same as those in the period a. Furthermore, charging the calibration capacitor Cc is performed in the same manner as in the period f of times t6 to t8, withdrawing of the electric charges by the current source 13 is performed in the same manner as in the period e of times t6 to t7 that is the first half, integration operation of the integration circuit is performed in the period of times t7 to t8 that is the second half, and the electric charges that are input to the integration circuit is accumulatively added (integrated) to the integration capacitor Cs1. Furthermore, thereafter, third integration operation is performed during times t10 to t15, and later an integration operation after the third integration operation is performed after time t15, for a predetermined number of times.

After the charging period of the period a, the charge amount that is discharged from the sensing capacitor Cxy is Cxyx (Vcharge-VHSP). A portion of the charge amount is withdrawn by the current source 13 during the period e, another portion of the charge amount is consumed to charge the calibration capacitor Cc during the period f, and the rest of the charge amount is input to the integration circuit. If the sum of the charge amount that is withdrawn by the current source 13 and the charge amount that is consumed to charge the calibration capacitor Cc, can be the same value as the capacitance value of the sensing capacitor at the time of non-touch, the charge amount that is input to the integration circuit can be provided by only the charge amount corresponding to the capacitance value that is increased by the touch. As a result, it is possible to efficiently determine the touch and non-touch. Here, "efficiently" means that S/N ratio of a signal that is input to the integration circuit is high, and as a signal value that is input can be suppressed to a minimum and thus the integration capacitor Cs1 can be formed by a small capacitor. However, reality is that the capacitance value of the integration capacitor cannot be exactly the same value as the capacitance value of the sensing the capacitor at the time of non-touch, and thus the integration capacitor is designed to include an appropriate margin.

In the example described above, an example is described, in which the electric charge is withdrawn by the current source 13, during the first half period (times t2 to t3) of the period (times t2 to t4) in which electric charge input from the sensing capacitor Cxy to the calibration capacitor Cc, but such control timing can be changed variously. After the time t1 when charging of the sensing capacitor Cxy is completed, a period in which the electric charge from the sensing capacitor Cxy is charged into the calibration capacitor Cc in a divided manner, and a period in which a portion of the electric charge is withdrawn by the current source 13 may be provided, and during a period until the time t4 where the input switch S2 of the integration circuit is opened, the rest of the electric charges among the electric charges charged into the sensing capacitor Cxy may be stably input to the integration circuit. As long as this condition is satisfied, a mutual relationship may be arbitrarily set, between the period in which the electric charge from the sensing capacitor Cxy is charged into the calibration capacitor Cc in a divided manner and the period in which a portion of the electric charge is withdrawn by the current source 13. The invention may be configured in such a manner that, for example, during the period of the times t2 to t3, the voltage is maintained as VSLF=Vcharge by the switch S3, the charge amount that is discharged from the sensing capacitor Cxy is withdrawn mainly by the current source 13, thereafter, for example, during times t3 to t4, the voltage is switched to VSLF=VHSP by the switch S3, and the charge amount that is discharged from the sensing capacitor Cxy flow into the calibration capacitor Cc.

It is preferable that when the current source 13 is not provided, the capacitance value of the calibration capacitor Cc be set so as to be the same value as the capacitance value of the sensing capacitor at the time of non-touch. For this reason, if the capacitor is formed on a semiconductor integrated circuit (IC), a large chip area is required, and in a case where a low chip cost is required, it is difficult to integrate on a chip. According to the invention, the sum of the charge amount that is withdrawn by the current source 13 and the charge amount that is consumed to charge the calibration capacitor Cc may be the same value as the capacitance value of the sensing capacitor at the time of non-touch, and thus the calibration capacitor Cc may have an extremely small capacitance value, and can be easily integrated onto an IC. The current source 13 and the switch S5 can be formed by active elements such as a MOSFET, and due to this influence on a chip area is small.

Control timing of each of the switches S1 to S5 is controlled by a control signal Csig2 that is output from a sequence control circuit (SQENC) 308. It is preferable that parameters which specify various periods for specifying each control timing be configured so as to be stored in, for example, the control register (CREG) 320. At this time, various periods include the initial charging period a described above, the period e in which the electric charge is withdrawn by the current source 13, the integration operation period f, a period b until when the withdrawal of the electric charges by the current source is started, by using the time when the vertical synchronization signal Vsync is changed as a reference, a period c until when a value of the power supply VSLF is switched, a period d until when the integration operation is started, a period g of the integration operation including the calibration, and a period h of the entire integration operation. In addition, the current value of the current source 13 may be configured so as to be able to be controlled by the parameters. Parameters that specify such periods can be separately adjusted by an electrical characteristic of the touch panel 1 that is connected to the touch controller 3. The parameters may be adjusted for each type, for example, and may be optimally adjusted for each individual that is actually connected.

[Second Embodiment]

Figure 8:
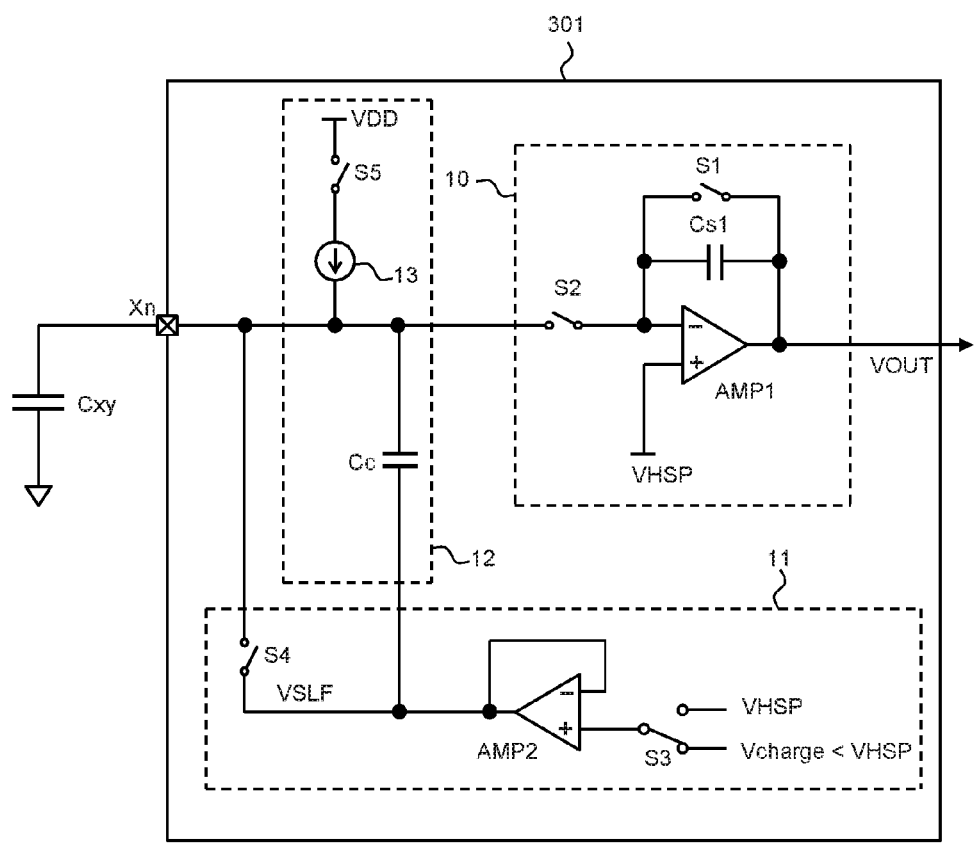
FIG. 8 is a circuit diagram partially exemplifying another configuration of the touch detecting circuit according to an embodiment of the invention.

FIG. 8 is a circuit diagram partially exemplifying another configuration of the touch detecting circuit according to an embodiment of the invention. In the same manner as in FIG. 6, only a circuit that uses one sensing capacitor Cxy as a detection target is illustrated in FIG. 8. A touch detecting circuit 301 is configured with a detecting circuit 10, a charging circuit 11, and a calibration circuit 12 that are connected to the one sensing capacitor Cxy which is a detection target, via the terminal Xn (any one of X1 to Xn).

For example, the detecting circuit 10 is an integration circuit such as that illustrated in FIG. 8 and is the same as the detecting circuit 10 illustrated in FIG. 6, and thus, the detailed description will be omitted.

The charging circuit 11 is also the same as the charging circuit 11 illustrated in FIG. 6, but is different from the charging circuit 11 illustrated in FIG. 6 in that by switching the switch S3, the voltage source VSLF is controlled to be the initial voltage VHSP or a charging voltage Vcharge with a lower potential than the initial voltage VHSP. In addition, as will be described later, moving direction of the electric charge is reversed, and thus the charging circuit 11 is called a discharging circuit 11.

The calibration circuit 12 is configured to include a calibration capacitor Cc, a switch S5, and a current source 13. In the same manner as in FIG. 6, the calibration capacitor Cc is connected between the terminal Xn and the voltage source VSLF, but is connected to a higher power supply than the charging voltage Vcharge or the initial voltage VHSP, that is, the power supply VDD of a circuit.

FIG. 9 is a timing chart exemplifying an operation of the touch detecting circuit of FIG. 8. As illustrated in FIG. 7, a horizontal axis denotes time, and on a vertical axis, a clock clk, a vertical synchronization signal Vsync, and signals that control the switches S4, S1, S2, S5, and S3, are illustrated from the top as digital waveforms, and furthermore, the power supply VSLF, a potential of the terminal Xn, and a voltage of the output Vout are illustrated as analog waveforms. The signals that control the switches S1, S2, S4, and S5 are positive logic.

In the same manner as in FIG. 7, during the period a of times t0 to t1, initialization of the integration circuit is performed, but, in contrast to FIG. 7, the sensing capacitor Cxy is discharged by the discharging circuit 11. At the time t0 when the vertical synchronization signal Vsync changes, the power supply VSLF is set to a lower potential Vcharge than the voltage VHSP by the switch S3, and by closing the switch S4, the sensing capacitor Cxy discharges toward the potential Vcharge via the terminal Xn. In the same time t0, the switch S2 that is an input of the integration circuit is opened and thereby the input is blocked. As the switch S1 is closed, the integration capacitor Cs1 is short circuited, discharged, and initialized, and the output VOUT is initialized to an initial voltage VHSP. At this time, the switch S5 is in an opened state and the current source 13 is blocked from the terminal Xn. In addition, the calibration capacitor Cc is short circuited by the switch S4, and the electric charge is not accumulated. In time t1, the switch S4 is opened, and thereby charging of the sensing capacitor is stopped, and in addition, the switch S1 is opened, and thereby the initialization of the integration circuit is completed.

Thereafter, during a period of times t2 to t4, the power supply VSLF is set to the voltage VHSP by the switch S3, and the electric charge flows into the sensing capacitor Cxy from the calibration capacitor Cc. During the period, in a period e of first half of the times t2 to t3, the switch S5 is closed, the current source 13 is connected to the terminal Xn, and the electric charge with a constant charge amount is injected into the sensing capacitor Cxy. At this time, the injected charge amount is specified by the product of the current value of the current source 13 and the period e. In a period f of second half of the times t3 to t4, the switch S2 is closed, and the electric charge from the integration circuit is injected into the sensing capacitor Cxy. As illustrated in FIG. 8, the integration circuit is configured with the operational amplifier AMP1 that is virtually grounded to the initial voltage VHSP, and thus, a potential of the terminal Xn to which the sensing capacitor Cxy is connected is close to the voltage VHSP. A potential of the sensing capacitor Cxy is the Vchrge lower than the VHSP, and thus, moving direction of the electric charge is a direction toward the sensing capacitor Cxy from the integration circuit, in contrast to those of FIGS. 6 and 7. That is, negative charge amount is input to the integration circuit. The electric charge that is input to the integration circuit is accumulatively added (integrated) to the integration capacitor Cs1, and thereby the output VOUT changes (increases). Thereafter, second integration operation is performed during the period of times t5 to t10, third integration operation is performed during times t10 to t15, and later an integration operation and subsequent operation thereafter are performed after time t15, for a predetermined number of times.

In the example described above, an example is described, in which the electric charge is injected by the current source 13, during the first half period (times t2 to t3) of the period (times t2 to t4) in which electric charges flow into the sensing capacitor Cxy from the calibration capacitor Cc, but such control timing can be changed variously, in the same manner as a case of the first embodiment described above. After the time t1 when charging of the sensing capacitor Cxy is completed, a period in which a portion of the electric charge from the sensing capacitor Cxy is charged in the calibration capacitor Cc, and a period in which another portion of the electric charge is injected by the current source 13 may be provided, and during a period until the time t4 when the input switch S2 of the integration circuit is opened, the rest of the charge amount among the electric charges discharged from the sensing capacitor Cxy may be input to the integration circuit stably as negative charge amount. As long as this condition is satisfied, a mutual relationship may be arbitrarily set, between the period in which a portion of the electric charge from the sensing capacitor Cxy is charged in the calibration capacitor Cc and the period in which another portion of the electric charge is injected by the current source 13.

As described above, in the second embodiment, direction of the electric charge is contrary to the embodiment illustrated in FIGS. 6 and 7, but the theory of operation is the same as each other. After the charging period of the period a, the charge amount that is charged to the sensing capacitor Cxy is Cxyx(VHSP-Vcharge). A portion of the electric charge is supplied from the current source 13 during the period e, another portion is supplied from the calibration capacitor Cc during the period f, and the rest of the electric charge is supplied from the integration circuit. Negative charge amount is input to the integration circuit. If the sum of the charge amount that is supplied from the current source 13 and the charge amount that is supplied from the calibration capacitor Cc can be the same value as the capacitance value of the sensing capacitor at the time of non-touch, the charge amount that is input to the integration circuit can be provided by only the charge amount corresponding to the capacitance value that is increased by the touch. As a result, in the same manner as in the first embodiment, it is possible to efficiently determine the touch and non-touch.

Even by the second embodiment, the calibration capacitor Cc may have an extremely small capacitance value, and can be easily integrated onto an IC.

Even in the second embodiment, the control timing of each of the switches S1 to S5 is controlled by the control signal Csig2 that is output from a sequence control circuit (SQENC) 308. It is preferable that the parameters which specify various periods for specifying each control timing and parameters which specify the current value of the current source 13 be stored in, for example, the control register (CREG) 320 and be configured to be adjusted according to the electric characteristic of the touch panel 1 to be connected.

As described above, the invention is specifically described based on the embodiments, but the invention is not limited to the embodiments, and it is understood that various modifications can be made in a range without departing from the gist.

For example, the display panel (DP) 2 may be a liquid crystal display panel, an organic EL display panel, or a display panel of other type. In addition, in a case of a liquid crystal display panel, the display panel may use an amorphous silicon type and may use a low temperature polysilicon type.

In addition, a configuration example of the touch detecting circuit that is described by referring to FIGS. 6 and 8, and the control timing thereof that is described by referring to FIGS. 7 and 9 are examples, the invention is not limited to these, and various modifications can be made in a range without departing from the gist.

What is claimed is:

1. A touch detecting circuit comprising:
   a charging circuit;
   a detecting circuit; and
   a calibration circuit,
   wherein the charging circuit and the detecting circuit are configured to be connected via a terminal to a sensing capacitor that is disposed on a touch panel,
   wherein the calibration circuit includes a calibration capacitor that is coupled to the terminal,
   wherein the charging circuit is configured to charge the sensing capacitor during a first period,
   wherein the detecting circuit is configured to discharge the sensing capacitor during a second period after the first period,
   wherein the calibration capacitor is configured to be charged by a first portion of electric charge that is discharged from the sensing capacitor during a third period included in the second period,
   wherein a second portion of the electric charge that is discharged from the sensing capacitor is discharged via a current source, during a fourth period included in the second period, and wherein a remaining portion of the electric charge discharged from the sensing capacitor is input to the detecting circuit during the second period.

2. The touch detecting circuit according to claim 1, wherein:
the current source that is coupled to the terminal is selectable between being on and being off.

3. The touch detecting circuit according to claim 1, wherein:
the detecting circuit is configured to measure a charge amount that is input.

4. The touch detecting circuit according to claim 1, wherein:
the charging circuit includes a voltage source configured to output a first voltage during the first period and to output a second voltage lower than the first voltage during the second period, and includes a first switch that is coupled between an output of the voltage source and the terminal.

5. The touch detecting circuit according to claim 4, wherein:
the detecting circuit includes an operational amplifier having a positive side input to which the second voltage is applied, an integration capacitor that is coupled between a negative side input and an output of the operational amplifier, and a second switch that is coupled between the terminal and the negative side input of the operational amplifier.

6. The touch detecting circuit according to claim 5, wherein:
the calibration capacitor is coupled between the terminal and the voltage source.

7. The touch detecting circuit according to claim 1, wherein:
the touch panel includes a plurality of sensing capacitors, and
the touch detecting circuit further comprises:
a plurality of sets of the charging circuit, the detecting circuit, and the calibration circuit that correspond to the plurality of sensing capacitors.

8. The touch detecting circuit according to claim 7, wherein the touch detecting circuit further comprises:
a plurality of sample and hold circuits configured to retain outputs of the plurality of detecting circuits.

9. The touch detecting circuit according to claim 8, wherein the touch detecting circuit further comprises:
a selector configured to select one output of the plurality of sample and hold circuits, and to output the selected output; and
an analog-to-digital conversion circuit configured to convert the selected output of the selector into a digital value and to output the digital value.

10. A touch detecting circuit comprising:
a discharging circuit, a detecting circuit, and a calibration circuit that includes a calibration capacitor that is connected to a terminal and that is configured to be coupled via the terminal to a sensing capacitor which is disposed on a touch panel,
wherein the discharging circuit is configured to discharge the sensing capacitor during a first period,
wherein the detecting circuit is configured to charge the sensing capacitor during a second period after the first period,
wherein the calibration capacitor is configured to be discharged by a first portion of electric charge that is charged to the sensing capacitor during a third period included in the second period, wherein a second portion of the electric charge that is charged to the sensing capacitor is supplied from a current source during a fourth period included in the second period, and
wherein a remainder of the electric charge charged to the sensing capacitor during the second period is input to the detecting circuit as a negative charge amount.

11. The touch detecting circuit according to claim 10, wherein:
current source coupled to the terminal is selectable between being on and off.

12. The touch detecting circuit according to claim 11, wherein:
the detecting circuit is configured to be able to measure a charge amount that is input.

13. The touch detecting circuit according to claim 10, wherein:
the charging circuit includes a voltage source configured to output a first voltage during the first period and to output a second voltage higher than the first voltage during the second period, and includes a first switch that is coupled between an output of the voltage source and the terminal.

14. The touch detecting circuit according to claim 13, wherein:
the detecting circuit includes an operational amplifier having a positive side input to which the second voltage is applied, an integration capacitor that is coupled between a negative side input and an output of the operational amplifier, and a second switch that is coupled between the terminal and the negative side input of the operational amplifier.

15. The touch detecting circuit according to claim 14, wherein:
the calibration capacitor is coupled between the terminal and the voltage source.

16. The touch detecting circuit according to claim 10, wherein:
the touch panel includes a plurality of sensing capacitors.

17. The touch detecting circuit according to claim 16, wherein the touch detecting circuit further comprises:
a plurality of sets of the charging circuit, the detecting circuit, and the calibration circuit that correspond to the plurality of sensing capacitors, and
a plurality of sample and hold circuits configured to retain outputs of the plurality of detecting circuits.

18. The touch detecting circuit according to claim 17, wherein the touch detecting circuit further comprises:
a selector configured to select an output from the plurality of sample and hold circuits and to output the selected output; and
an analog/digital conversion circuit configured to convert the selected output of the selector into a digital value, and to output the digital value.

19. A semiconductor integrated circuit comprising:
a single semiconductor substrate on which a charging circuit, a detecting circuit, and a calibration circuit are disposed,
wherein the charging circuit and the detecting circuit are configured to be connected via a terminal to a sensing capacitor that is disposed on a touch panel,
wherein the calibration circuit includes a calibration capacitor that is coupled to the terminal,
wherein the charging circuit is configured to charge the sensing capacitor during a first period, wherein the detecting circuit is configured to discharge the sensing capacitor during a second period after the first period, wherein the calibration capacitor is configured to be charged by a first portion of electric charge that is discharged from the sensing capacitor, during a third period included in the second period, wherein a second portion of the electric charge that is discharged from the sensing capacitor is discharged via a current source, during a fourth period included in the second period, and wherein a remaining portion of the electric charge discharged from the sensing capacitor is input to the detecting circuit, during the second period.

20. The semiconductor integrated circuit according to claim 19, further comprising:

a display drive circuit that is coupled to a display panel which is configured to overlap the touch panel and is configured to perform control of driving of the display panel on the semiconductor substrate.

* * * * *